United States Patent
Luiz et al.

(10) Patent No.: US 7,893,775 B2
(45) Date of Patent: Feb. 22, 2011

(54) FREQUENCY DIVERSE DISCRETE-TIME PHASE-LOCK DEVICE AND APPARATUS

(75) Inventors: David A. Luiz, Sebastopol, CA (US); Robert J. Buck, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 75 days.

(21) Appl. No.: 12/058,243

(22) Filed: Mar. 28, 2008

(65) Prior Publication Data

US 2009/0243735 A1 Oct. 1, 2009

(51) Int. Cl.
*H03L 7/091* (2006.01)
*H03L 7/085* (2006.01)

(52) U.S. Cl. .................... 331/25; 331/1 A; 327/156; 327/159

(58) Field of Classification Search ............... 331/1 A, 331/16, 17, 25; 327/156, 159; 375/376
See application file for complete search history.

(56) References Cited

U.S. PATENT DOCUMENTS

| | | | | |
|---|---|---|---|---|
| 5,999,060 A * | 12/1999 | Zuta | ............................ | 331/14 |
| 6,353,647 B1 * | 3/2002 | Wilhelmsson et al. | ....... | 375/376 |
| 6,888,342 B2 * | 5/2005 | Bradley | ................... | 324/76.19 |
| 7,042,972 B2 * | 5/2006 | Fahim | ........................ | 375/376 |
| 2004/0146132 A1 * | 7/2004 | Staszewski et al. | ......... | 375/376 |

OTHER PUBLICATIONS

Kevin Johnson, "Measure PLL Open-Loop Response With The Loop Closed," Electronic Design Magazine. Nov. 22, 1990, pp. 79-86.
Tim Wescott, "Applied Control Theory for Embedded Systems," ISBN-13:978-0-7506-7839-1, Chapter 9, Section 3 entitled "In Loop Measurement," pp. 229-234, Apr. 2006.

* cited by examiner

*Primary Examiner*—Robert Pascal
*Assistant Examiner*—Ryan Johnson

(57) ABSTRACT

A discrete-time phase lock loop (DTPLL) includes an analog section comprising a digital-to-analog converter (DAC) and an oscillator, operative to provide a clock signal based on an input from the DAC. The DTPLL also includes a digital signal processor (DSP). The DSP includes a loop controller state machine; a phase detector; a counter, operative to receive clock signals from the oscillator and to provide a count value to the phase detector; a divider, operative to receive a reference signal and to provide a reference pulse output to the phase detector; and a loop filter operative to provide a control effort value based on an output from the phase detector. Based on the phase error value, an output of the oscillator is changed to reduce the phase error to a steady state value.

21 Claims, 4 Drawing Sheets

FREQUENCY DIVERSE DISCRETE-TIME PHASE-LOCK DEVICE AND APPARATUS

BACKGROUND

Many devices rely on the synchronization of an internal signal frequency to an external signal frequency. This synchronization may be used for frequency tuning in communications devices (e.g., phones, GPS devices, etc.), or clock synchronization in a variety of devices such as measurement devices. This synchronization is often effected by phase-lock techniques.

One type of measurement device is a combination signal analyzer/network analyzer (SANA). The SANA instrument typically contains a single reference frequency oscillator to which other oscillators in the system are phase-locked. These oscillators are used for frequency translation in the receiver conversion chain as well as for sampling clocks in the data acquisition system. As will be appreciated the frequency accuracy and stability of these oscillators affect the quality of measurements.

Often, it is useful to phase-lock the internal oscillators to an external signal to eliminate relative frequency or timing errors, or both, between the measuring instrument and the equipment under test. In addition absolute frequency accuracy of spectrum measurements and network S-parameter measurements are also greatly improved by using comparatively high accuracy reference sources such as those derived from atomic clocks.

The internal oscillator (also referred to as the internal reference source) is used to derive the local oscillators and clocks used in the system. To improve the instrument frequency accuracy, a continuous-time phase-lock loop (CTPLL) is often used to lock the internal reference source ($f_o$) to an external reference source ($f_{ref}$). A CTPLL can be considered a frequency multiplier where the output frequency $f_o$ is an integer-multiple R of the reference frequency, $f_{ref}$. For a given design, $f_o$ is fixed by system design considerations and in many designs R is a fixed integer. Because R is an integer the loop can only lock to a limited set of reference frequencies defined by the equation $f_o/R$.

Limiting the CTPLL multiplication to a fixed integer R is highly desirable in mobile instruments to simplify the required circuitry. However, this presents a serious limitation because it eliminates the possibility of frequency diversity as well as restricting the single $f_{ref}$ to an integer sub-multiple of $f_o$. These constraints can be partially relaxed by allowing R to be variable but this still constrains $f_{ref}$ to steps of $f_o/R(R-1)$. A further refinement of the CTPLL is the addition of a fractional divider for R in the feedback. However, while this provides the desired frequency diversity and arbitrary ratio of $f_o/f_{ref}$, the required circuit complexity is significantly increased and often requires mixed signal technologies with correspondingly higher power consumption and board space requirements. As will be appreciated, this added complexity is undesirable both from a space perspective and from a cost perspective.

There is a need, therefore, for a phase-locking that overcomes at least the shortcoming of known phase-lock techniques described above.

SUMMARY

In accordance with a representative embodiment, a discrete-time phase lock loop (DTPLL) includes an analog section comprising a digital-to-analog converter (DAC) and an oscillator, operative to provide a clock signal based on an input from the DAC. The DTPLL also includes a digital signal processor (DSP). The DSP includes a loop controller state machine (LCSM); a phase detector; a counter, operative to receive clock signals from the oscillator and to provide a count value to the phase detector; a divider, operative to receive a reference signal and to provide a reference pulse output to the phase detector; and a loop filter operative to provide a control effort value based on an output from the phase detector. Based on the control effort value, an output of the oscillator is changed to reduce the phase error to a steady state value.

In accordance with another representative embodiment, an instrument includes a DTPLL. The DTPLL of the instrument includes an analog section comprising a digital-to-analog converter (DAC) and an oscillator, operative to provide a clock signal based on an input from the DAC. The DTPLL also includes a digital signal processor (DSP). The DSP includes a loop controller state machine (LCSM); a phase detector; a counter, operative to receive clock signals from the oscillator and to provide a count value to the phase detector; a divider, operative to receive a reference signal and to provide a reference pulse output to the phase detector; and a loop filter operative to provide a control effort value based on an output from the phase detector. Based on the control effort value, an output of the oscillator is changed to reduce the phase error to a steady state value.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

It is to be understood that the terminology used herein is for purposes of describing particular embodiments only, and is not intended to be limiting.

As used in the specification and appended claims, the terms 'a', 'an' and 'the' include both singular and plural references, unless the context clearly dictates otherwise. Thus, for example, 'a device' includes one device and plural devices.

DETAILED DESCRIPTION

In the following detailed description, for purposes of explanation and not limitation, representative embodiments disclosing specific details are set forth in order to provide a thorough understanding of the present teachings. Descriptions of known systems, devices, materials, methods of operation and methods of manufacture may be omitted so as to avoid obscuring the description of the example embodiments. Nonetheless, systems, devices, materials and methods that are within the purview of one of ordinary skill in the art may be used in accordance with the representative embodiments.

As described more fully herein, the representative embodiments relate generally to DTPLLs, having a significant portion of their functionality instantiated in a digital signal processor (DSP). As will become clearer as the present description continues, comparatively little analog hardware is required for the DTPLLs, providing the advantage, among others, of reduced complexity. The DTPLLs are contemplated for use in one or more of a variety of applications, including but not limited to measurement and testing devices. These devices may be hand-held devices, or may be stand alone measurement and testing devices. Alternatively, the DTPLL may be implemented in a system that requires timing synchronization.

The present teachings contemplate use of the DTPLL of the representative embodiments in measurement and testing devices such as network analyzers and signal analyzers, spectrum analyzers, signal generators and oscilloscopes. Such devices may be commercially available from companies such as Agilent Technologies, Inc., Santa Clara, Calif.; Tektronix Corporation, Beaverton, Oreg.; and Fluke Corporation, Everett, Wash. Alternatively, the DTPLL may be implemented in one of a variety of devices with disparate applications. For instance, the DTPLL may be used to lock to a GPS timing signal, and as such may be useful in communications devices (e.g., mobile phones) that have a GPS functionality. Still other applications are contemplated.

Figure 1:
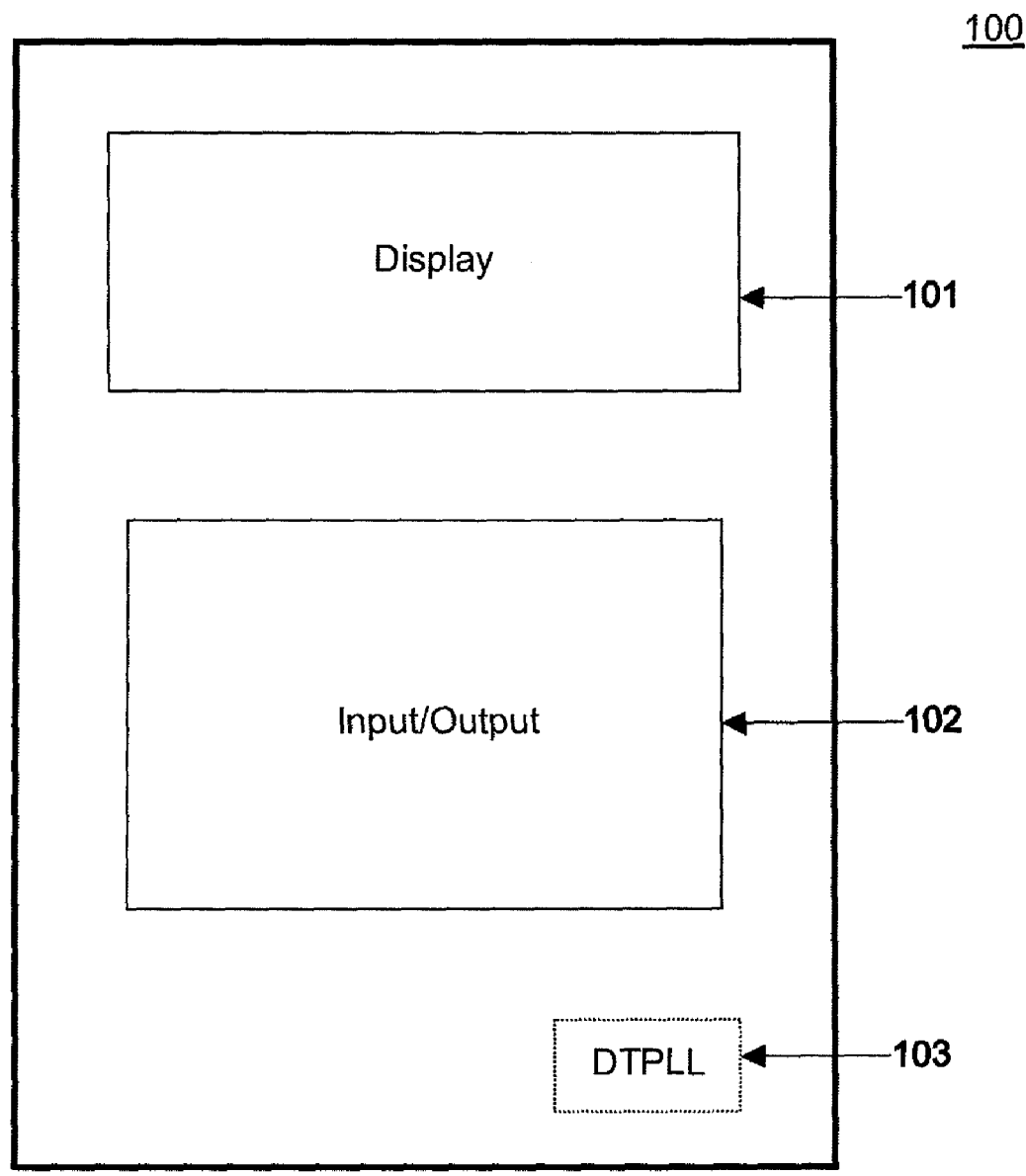
FIG. 1 is a conceptual view of an instrument in accordance with a representative embodiment.

FIG. 1 is a conceptual view of an instrument 100 in accordance with a representative embodiment. The instrument 100 may be one of those described above and includes a display 101, an input/output interface 102 and a DTPLL 103 in accordance with a representative embodiment. The input/output interface 102 may include control logic (e.g., a graphic user interface (GUI)) for the instrument and the display 101 may be, for example, a data display data, or an input interface, or both. The DTPLL 103 is implemented in analog hardware and a DSP, both of which are described in greater detail in connection with FIGS. 2 and 3.

Figure 2:
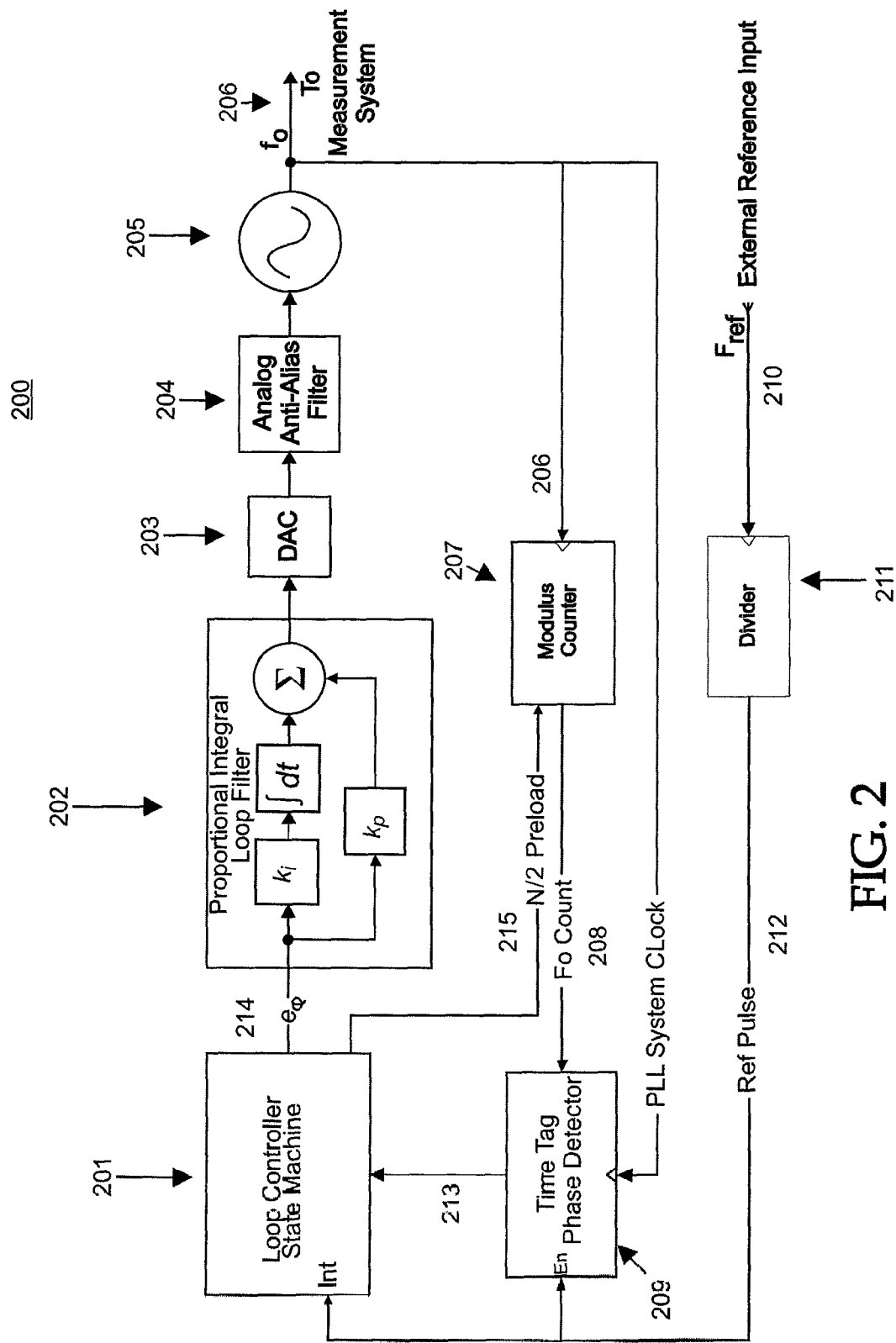
FIG. 2 is a simplified schematic diagram of a discrete-time phase-lock loop (DTPLL) in accordance with a representative embodiment.

FIG. 2 is a simplified schematic diagram of a discrete-time phase-lock loop (DTPLL) 200 in accordance with a representative embodiment. The DTPLL 200 includes a LCSM 201. As described more fully below, among other functions, the LCSM 201 computes the phase error ($e_\phi$) and provides a phase error signal 214 to a loop filter 202. The loop filter 202 of the representative embodiment comprises a proportional integral (PI) loop filter having an integrator, a multiplier and an adder. The loop filter 202 also comprises registers that include functional parameters for the integrator and adder. The function of these and other registers are described more fully below.

The loop filter 202 receives the phase error signal 214 and after performing operations provides an output to a digital to analog converter (DAC) 203 (e.g., a 16 bit DAC). The output is representative of the phase error present between the oscillator signal and the reference (external) signal. The output to the DAC 203 from the loop filter 202 may be referred to herein as a control effort value or simply as a control effort.

The DAC 203 provides an output to an analog anti-alias filter 204, which in turn provides an output to an oscillator 205. In a representative embodiment, the oscillator 205 is a voltage controlled temperature compensated crystal oscillator (VCTXO), and the input from the DAC 203 is an analog voltage that drives the VCTXO. As will become clearer as the present description continues, the drive signal to the VCTXO will increase the oscillation frequency or decrease the oscillation frequency incrementally until a so-called wander-off condition is returned to a phase-lock.

An oscillator output 206 at an oscillator frequency, $f_o$, is provided to a measurement system (not shown) and to an N modulus counter 207. Illustratively, the counter is a known 28 bit N modulus counter. The counter 207 is a roll-over counter that counts the pulses from the oscillator 205 and provides a count 208 to phase detector (phase detector) 209. The phase detector 209 is illustratively a 28 bit latch time-tag phase detector.

An external reference input signal 210 is provided to a divider 211, which is operative to divide the input frequency by an integer M, and to provide an output pulse 212 at a rate equal to the frequency of the reference input signal, $f_{ref}$, divided by M. The divider 211 is illustratively a 28 bit M modulus counter configured to perform a divide function.

The output pulse 212 enables the time-tag phase detector 209 to capture the count value 208 from the counter 207. As described below, an output 213 at the sample rate from the phase detector 209 is provided to the LCSM 201, which calculates the phase error relative to a reference phase value set at a register (not shown in FIG. 2) of the phase detector 209.

In accordance with a representative embodiment, the sample rate is selected up to a maximum of the greatest common divisor of the reference frequency, $f_{ref}$, and the oscillator frequency, $f_o$, and is used to establish the loop bandwidth (LBW). As should be appreciated by one of ordinary skill in the art, a lower LBW provides less susceptibility to reference signal jitter, although the time-to-lock can be comparatively high. By contrast, a higher LBW provides a faster lock time, but transfers proportionally more of the reference signal jitter to the oscillator. The embodiments of the present teachings can provide either a comparatively high or a comparatively low LBW through the selection of parameters. Notably, a comparatively low LBW is often desired in measurement applications.

Illustratively, the LBW is on the order of approximately $1/10$th the sample rate. In a representative embodiment, parameters are set in sequence, with first the selection of an LBW. This allows the sample rate to be readily determined. Once the sample rate is known, the divisor, M, is set at a register (not shown in FIG. 2) of the divider 211, where M is equal to $f_{ref}$ divided by the sample rate. For illustrative purposes, if the desired LBW were 1 Hz, then the sample rate could be set to 10 Hz. If the reference signal has a frequency ($f_{ref}$) of 10 MHz, M is set to $10^6$.

In a representative embodiment, counter 207 cycles though its count sequence once every N cycles of the oscillator signal 206 (at $f_o$) and provides count value output 208 to the phase detector 209. As described more fully herein, the counter 207 is set to a mid-range value (N/2) initially. As described more fully herein, the LCSM 201 provides an N/2 preload signal 215 to the counter 207, setting the mid-range value. The counter 207 rolls over after N cycles, and the initial selection prevents the DTPLL 200 from entering an uncontrolled correction. The divider 211 outputs pulses 212 once every M cycles of the reference signal (i.e., at $f_{ref}/M$). At the first output of the Ref pulse 212, the latched count value output 208 in the phase detector 209 is saved in a register by the LCSM 201. This initial output provides a phase reference against which subsequent latched count values 208 are compared to determine the phase error ($e_\phi$).

If a subsequent latched count value 208 is the same as the reference phase value then Ref pulse 212 has a substantially fixed phase relation to the clock driving the counter 207. Stated somewhat differently, if the counter 207 rolls over and counts to the same number with each Ref pulse 212, the phase of the clock driving the counter 207 relative to the Ref pulse 212 is unchanged. The clock driving the counter 207 is, of course, the oscillator output 206, and therefore the oscillator output 206 has a substantially fixed phase relation to Ref pulse 212. Ref pulse 212 is synchronous with $f_{ref}$ and therefore $f_{ref_{is}}$ phase locked to $f_o$.

Quantitatively, when the DTPLL is locked to within threshold, the condition:

$$(f_o/N)=(f_{ref}/M)$$

is met. From this relation, it clear that the count cycle rate of the counter 207 is equal to the sample rate, and thus the oscillator and the reference signal are of substantially the same phase.

Locking of the DTPLL 200 involves incremental changes of the oscillator frequency over multiple cycles until the above condition is met. As described, with each Ref pulse 212, the count value 208 from the counter 207 is latched. Notably, the counter 207 rolls over at the same count value of N−1 and repeats the count sequence from zero. As such, the Ref pulse 212 is latching a value one time for each count sequence. If a subsequent latch value finds that the counter 207 has rolled over and counted to a higher number (i.e., a higher count value 208), the clock driving the counter is leading the Ref pulse 212 and must be driven down in frequency until the phase error ($e_\phi$) is returned to within the specified threshold. Alternatively, if the subsequent latch value finds that the counter 207 has rolled over and counted to a lower number (i.e., a lower count value 208), the clock driving the counter is lagging the Ref pulse and must be driven up in frequency until the phase error is returned to within the specified threshold.

As described more fully herein, with every output Ref pulse 212 of the divider 211, the phase error ($e_\phi$) is computed. If, in a subsequent cycle (i.e., sample period), the latched count value 208 differs from the reference phase value the phase error is non-steady-state. By contrast, if the current latched count value is the same as the latched count value captured in the previous sample period, the phase error ($e_\phi$) has reached a steady-state value. When the DTPLL 200 achieves an operating point where the phase error has reached a steady-state value, the DTPLL 200 is operating in a steady state phase-lock condition.

As in a CTPLL with an integer divider in the feedback path, the DTPLL phase detector reference frequency determines the frequency resolution of the external reference to which the loop can lock. In the DTPLL the phase detector reference frequency also sets the sample rate of the system which in turn limits the loop bandwidth (LBW). The required LBW is determined by the phase-noise characteristics of the VCO and the frequency stability of the reference that the loop is locked to. For example, a GPS 1 pulse per second (PPS) timing signal has relatively poor short term stability. The jitter can be as poor as 100 nsec, but the mean period of the 1PPS signal over long intervals is comparatively stable. For this type of signal the required LBW is in the sub-Hz range so that the PLL can effectively act as a low pass filter with the appropriate cutoff frequency to suppress the short term jitter. On the other hand if the reference signal was a lab grade 10 MHz standard, the desired LBW might be in the range of 1 Hz to 100 Hz depending on the phase-noise characteristics of the oscillator 205 and the system phase-noise requirements.

Notably, the DTPLL 200 of the representative embodiments includes an analog section comprising the DAC 203, the filter 204 and the oscillator 205. This analog section is illustratively implemented in hardware. All other components of the DTPLL 200 are provided in a digital signal processor (DSP). In an illustrative embodiment, the DSP comprises a field programmable gate array (FPGA), although other forms of programmable logic within the purview of one having ordinary skill in the art may be implemented. As will become clearer as the present description continues, the required level of programmability can be comparatively low; allowing mostly for the setting of certain parameters in registers. Of course, additional functionality may be provided with elaborate programming options. Regardless, the DTPLLs of the present teachings have a comparatively reduced reliance on analog hardware, which beneficially fosters reduced board space requirements and reduced circuit complexity.

Figure 3:
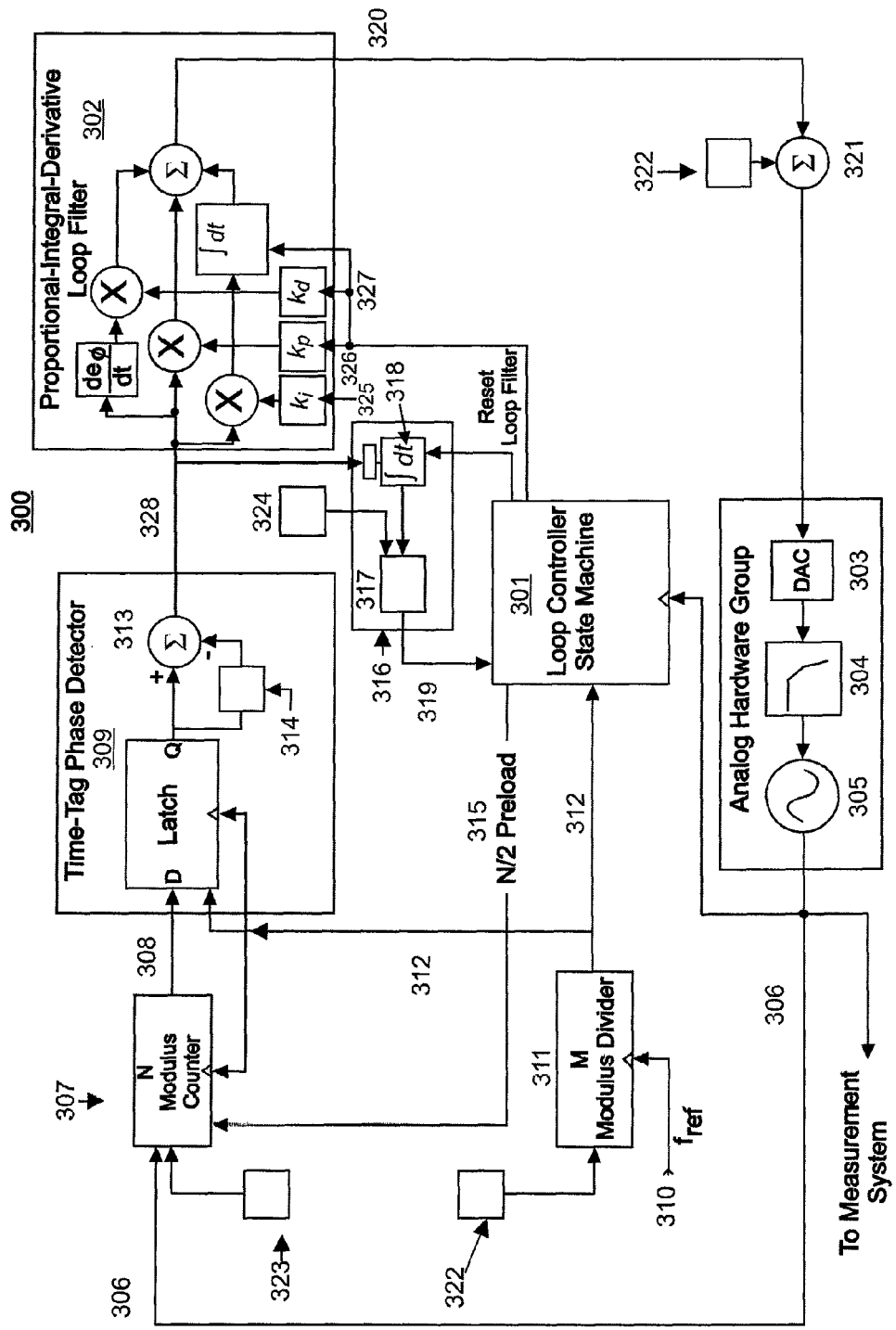
FIG. 3 is a simplified schematic diagram of a DTPLL in accordance with a representative embodiment.

FIG. 3 is a simplified schematic diagram of a discrete-time phase-lock loop (DTPLL) 300 in accordance with a representative embodiment. The DTPLL 300 includes many features of the DTPLL 200 described in conjunction with FIG. 2. Details of such common features are often not repeated in order to avoid obscuring the presently described embodiment.

The DTPLL 300 includes a LCSM 301, which is substantially identical to the loop controller state machine 201. The DTPLL 300 also includes a loop filter 302, which is illustratively a proportional integral derivative (PID) loop filter, and provides a faster response time for the DTPLL 300. The output of the filter 302 is provided to an analog hardware group, which comprises a DAC 303, an anti-aliasing filter 304 and an oscillator 305. With the exception of this hardware group, all other functionality of the DTPLL 300 is instantiated in a DSP, such as an FPGA. As discussed previously, certain benefits are realized by the DTPLL 300 as a result of the use of digital logic and a comparatively reduced reliance on analog hardware.

The oscillator 305 provides an oscillator output 306 to a counter 307, which is substantially identical to counter 206. The counter provides a count value 308 to a phase detector 309. A divider 311, which is substantially identical to divider 211, receives an external reference input 310 at a reference frequency, $f_{ref}$, and divides the reference frequency by a factor M. The divider 311 outputs a Reference pulse (Ref pulse) 312 at a selected sample rate to the phase detector 309 and the LCSM 301. As described more fully herein, the LCSM 301 uses the Ref pulse 312 as a state transition signal. That is, a transition to a next state in a state diagram will not occur until Ref pulse 312 asserts. As will become clearer as the description continues, this is useful for some states as actions the LCSM 201 performs in those states depend on valid information's (e.g., various data values in the loop filter) being present.

In a manner substantially the same as described previously in connection with the embodiments of FIG. 2, with each output Ref pulse 312, the phase detector 309 latches the count value 308. A phase error ($e_\phi$) 328 is computed at the phase detector 309 by a subtractor 313, which calculates a difference between a phase reference value stored in a register 314 and the count value 308. In a similar manner described in connection with DTPLL 200, at every output Ref pulse 312 of the divider 311, the phase error ($e_\phi$) is computed. In a subsequent cycle (i.e., sample period), the latched count value 308 may differ from the reference phase value such that the phase error is non-steady-state. When the DTPLL 300 achieves an operating point where the phase error is a non-steady-state value, the DTPLL 300 is not operating in a steady state phase-lock condition.

In the embodiment of the DTPLL 300 including the PID filter 302, steady state of the phase error is simply when the first derivative of the phase error is zero or within a threshold value (ideally zero). By contrast, when the first derivative of the phase error is greater than zero or the threshold, the phase error is non-steady state. The reference phase value establishes a somewhat arbitrary phase value at a fixed point in time. Subsequent count values are subtracted from this reference count in the phase detector 309, which provide a phase offset. Notably, with a proportional (P) loop filter the loop will servo to a steady state (first derivative=0) but will have some offset from the reference phase value. With a PI loop filter, such as incorporated in the embodiment of FIG. 2, the integrator term forces the offset to zero. Regardless, detecting a steady state condition is useful to characterize whether the DTPLL 200, 300 is phase-locked or not. In the representative embodiment including a PI filter, the phase detector will be detecting some deviation from zero as contrasted with a proportional (P) only filter where the phase detector must look the deviation from previous value (derivative).

If the current latched count value is the same as the latched count value captured in the previous sample period (i.e., previous cycle), the phase error ($e_\phi$) 328 has reached a steady-state value. When the DTPLL 300 achieves an operating point where the phase error has reached a steady-state value, the DTPLL 300 is operating in a steady state phase-lock condition.

The phase error 328 is provided to the loop filter 302 and to a phase lock detector 316. The phase lock detector 316 comprises a threshold comparator, which compares the phase error to a threshold value 317 above which the DTPLL 300 is considered to be out of lock. The phase lock detector 316 also comprises an integrator 318, which integrates the absolute value of the phase error 328 over a number of samples. As shown, a lock state indicator value 319 is provided to the LCSM 301. The loop filter 302 computes a control effort value 320 and provides the control effort value to an adder 321. The control effort value 320 is added to the calibration value stored in a register 322 and the sum is provided to the DAC 303. Based on the input to the DAC 303, the oscillator frequency, $f_o$, is increased, or decreased, or left unchanged.

Changes in the oscillator frequency, $f_o$, are made incrementally until lock is attained. In the present embodiment, a PI or PID filter design is illustrated but many other loop filter designs known to control systems engineers could be used successfully in place of a PI or PID filter (e.g., a Kalman filter). In embodiments including a PI filter, the control effort and ultimately the DAC value are determined by a scaled version (i.e., by a scaling factor, kp) of the phase error plus the integral of a scaled version (i.e., by a scaling factor, ki) of the phase error. The presence of the integral term together with negative feedback will "automatically" drive the phase error to zero. By contrast, a proportional filter (i.e., with only scaling factor kp) will not drive the phase error to zero but will drive it to a constant or steady state value.

The DTPLL 300 includes a number of registers, which may be provided in the DSP or FPGA. The populating of registers of various components of the DTPLL 300 is effected via host control software via a hardware interface. The registers may be populated with initial or reference values for attaining certain lock conditions. These values and their functions are described presently. Notably, although not shown in or described in connection with FIG. 2, many of the registers and parameters described in connection with FIG. 3 are applicable to the embodiments described in connection with FIG. 2.

A divide value register 322 includes a value (M), which as described previously is determined based on a desired sample rate and on the external reference frequency $f_{ref}$. A register 323 includes a terminal count value (N) for the counter 307, which as described previously, is determined based on a desired sample rate and on the oscillator 305 frequency $f_o$.

The initial count value is set to approximately the mid-range (N/2) of the capacity of the counter 307 in order to avoid erroneous behavior by keeping the count value 308 relatively consistent once lock is attained. As described more fully herein, the LCSM 301 provides an N/2 preload signal 315 to the counter 307, setting the mid-range value.

Setting the count-value at approximately the mid-range point provides certain benefits. If the count value were near the counter terminal count (N) when achieving a locked condition, as the phase of the oscillator 305 changes relative to the reference counter, the latched count value 308 may be on either side of the counter terminal count value (i.e., slightly less than N, or at a small positive value). When compared to the reference value in the phase detector 309, the relative phase of the oscillator 305 and the reference signal 310 may be difficult to determine. For instance, suppose the range of the counter were 100. If the reference count value were set at 1, and the count value at a subsequent cycle was 98, the phase of the oscillator 305 could be interpreted as leading the reference signal 310 by a phase commensurate with 97 counts; or could be interpreted as lagging the reference signal by a phase commensurate with 3 counts. By pre-loading the counter 307 to a mid-range value and simultaneously establishing a reference phase at this mid-range value, the terminal count region is avoided thereby removing the ambiguity in determining the relative phase of the oscillator 305 and the reference signal 310.

In a representative embodiment, a threshold register 324 stores a threshold value. This threshold value is illustratively a trip level setting for determining when the DTPLL 300 is phase-locked. In a representative embodiment of the present teachings, phase-lock is defined as the condition when the phase of the oscillator signal has a substantially fixed relation to the phase of a reference signal. It may be the case that this relation is not only fixed but also zero degrees (in phase). In the present embodiment, the phase-lock detector 309 uses a 4-point moving average filter and requires that the average value of the relative phase be zero plus or minus a threshold value. Comparing the absolute value of the phase error to a threshold value effectively implements a phase window comparator. Longer or shorter average filters can also be used depending on how quickly the detection of an un-lock condition is needed by the end application of the DTPLL.

Alternatively, the phase-lock condition can be defined as the change of phase relationship (error) from sample to sample, where the change is compared to a threshold value. This is accomplished by applying the appropriate filter to the phase error values before comparison with the threshold value. The determination of the threshold value is linked to the desired limit on the change in phase relationship between the oscillator and the reference signal for consideration of a phase-locked condition. Ideally, any value other than zero change in phase relationship would be considered an unlock condition. However due to noise in the system, either analog or digital quantization, a practical limit for a phase-lock condition is a change of 1 or less.

In the representative embodiments the integer phase error values represent certain physical measures. One such physical measure is the time resolution of the phase error value, which is set by the clock rate of the counter or $1/f_o$. Another physical measure is one full cycle of the reference signal or 360 degrees, which is $1/f_{ref}$ seconds. Relating then the time resolution of the phase detector to a full $f_{ref}$ cycle yields: $(1/f_o)/(1/f_{ref})$ or $f_{ref}/f_o$. Thus in degrees, one count of the phase detector represents $f_{ref}/f_o*360$. By way of example, if $f_o=100$ MHz and $f_{ref}=10$ MHz, the phase detector resolution is 36 degrees. In this scenario if the threshold value is set at 2 then a change in phase of −36 degrees, 0 degrees, or +36 degrees would be considered a phase-lock condition but −72 degrees or smaller and +72 degrees or larger would be considered an un-lock condition.

The loop filter 302 includes an integral register 325; a proportional register 326 and a derivative register 327. The respective loop filter values of these registers can be determined analytically or empirically. As is known, in process control where PID controllers are used most often, an empirical tuning method is used. One such method observes the over-shoot, ringing and settling time of the closed-loop response to a step on the input. In the DTPLL 300, a frequency step is applied to reference frequency, $f_{ref}$, 310 and the loop filter parameters are tuned for the desired response of $f_o$. Once the loop is "tuned" for given operating conditions, the PID values are fixed to the tuned values.

In accordance with another embodiment, a second method of tuning the loop filter parameters includes the so-called control systems engineering open-loop gain response measurement. In this method, a disturbance signal is injected into the loop and the open-loop gain is computed from measurements of a response signal before and after the injection point. Bode plots of the gain may be used to view the LBW and corresponding phase margin while tuning the loop filter parameters (e.g., register values) for the desired performance. While this method is most commonly carried out in an analog control loop with analog methods, in the DTPLL either an analog or digital implementation is possible. For an analog implementation, the ideal disturbance signal injection point is between the DAC 303 output and the anti-alias filter 304 input. Further details of this illustrative method may be found in "Measure PLL Open-Loop Response With The Loop Closed", Electronic Design Magazine, Nov. 22, 1990, pg 79-86 by Kevin Johnson HP Lake Steven's Instrument Division. The disclosure of this article is specifically incorporated herein by reference.

Alternatively, in another embodiment comprising a digital implementation, the injection site is illustratively located at the loop filter output 320. Additional details of such a digital implementation may be found in "Applied Control Theory for Embedded Systems," by Tim Wescott ISBN-13:978-0-7506-7839-1, Chapter 9, section 3 entitled "In Loop Measurement." The disclosure of this section of Chapter 9 is specifically incorporated herein by reference. The digital implementation is beneficial because additional hardware or test equipment is substantially avoided.

Figure 4:
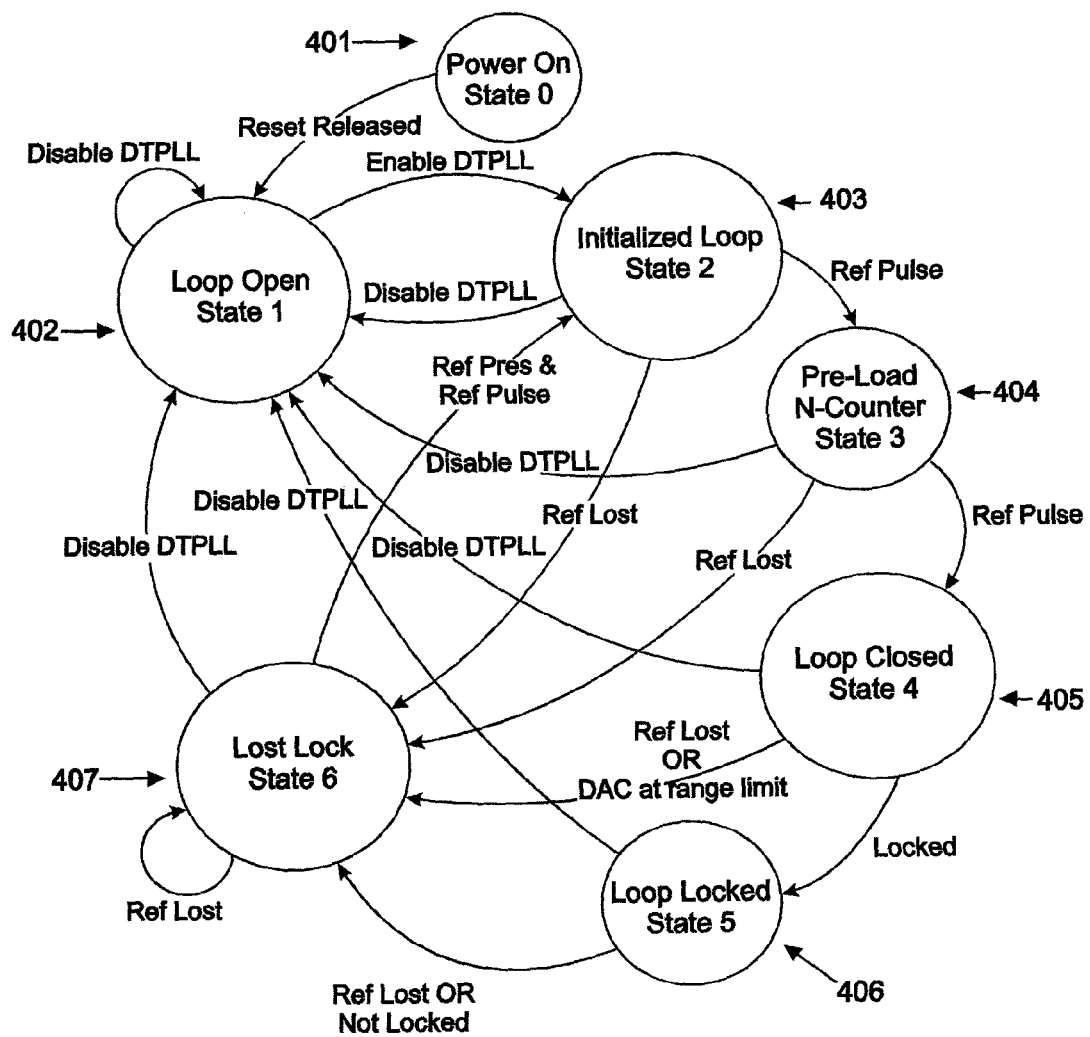
FIG. 4 is a state transition diagram of a DTPLL LCSM in accordance with a representative embodiment.

FIG. 4 is a state transition diagram (diagram) 400 of a DTPLL LCSM in accordance with a representative embodiment. The transition diagram may be for the LCSMs 201, 301 described previously. The state transition diagram is useful in describing certain functionality of the loop controllers 201, 301 in their use in the DTPLLs of the representative embodiments. It is emphasized that the functionality described is merely illustrative and greater and lesser functionality are contemplated.

The LCSM 201, 301 orchestrates the sequencing of events required to enable the negative feed back control system to achieve a steady state phase-lock condition. Additionally the LCSM 201, 301 accepts user input data, detects and recovers from DAC range limiting, detects and recovers from loss of a reference signal, and sets the lock state indicator. The diagram 400 comprises seven states, which are used for controlling the event sequence. However, as noted previously, other sequences (and thus functionality) with more or perhaps fewer states would be possible. The seven states used for this design are: Power On 401 (State 0); Loop Open 402 (State 1); Initialize Loop 403 (State 2); Pre-Load N-Counter 404 (State 3); Loop Closed 405 (State 4); Loop Locked 406 (State 5); and Lost Lock 407 (State 6).

As is often the case with finite state machine design, transitions from state to state only occur synchronous with the system clock. The state of various inputs at the time a system clock edge occurs will determine the next state the machine will sequence to. At each state, various outputs are generated that provide the proper control of various DTPLL components.

When power is applied or when an external reset signal is asserted the LCSM 201, 301 always goes to the Power On state 401 and remains in this state until a reset signal is released. As noted previously, prior to releasing the reset signal, all static registers that determine the operative results of the DTPLL must be populated by external system software. Release of the reset signal then sequences the LCSM to the Loop Open state 402.

Loop Open state 402 effectively disables the operation of the DTPLL 200, 300. In a representative embodiments, the Loop Open state 402 functions to: 1) write a calibration value to the DAC so that a nominal oscillator frequency, $f_o$, with minimal frequency error is realized in the open loop or unlocked state; and 2) clear a state bit indicating an unlocked or loop open condition. The external signal "Disable PLL" controls whether the LCSM returns to or remains in this state. Upon clearing the Disable PLL signal (Enable PLL), the LCSM 201, 301 advances to the Initialize Loop state 403. It is emphasized that in the representative embodiments, states 401 through 407 return to the Loop Open state 402 if the user initiated Disable PLL signal is asserted.

In a representative embodiment, the Initialize Loop state 403 acts to: 1) preload the lock detector filter with a maximum possible value so that its output begins with values representing an unlocked condition; 2) enable the phase reference register to begin capturing the phase value from the N-counter; and 3) populate the loop filter output with a most recently held locked value if this state was entered from the Lost Lock state. Otherwise populate it with zero. As shown in the diagram 400, advancement to the Pre-Load N-Counter state occurs on the assertion of the Ref Sig Present and Ref-Pulse 312. In the event that the external reference signal is no longer present as detected by an external device (Ref Sig Lost), the LCSM 201, 301 advances to the Lost Lock state rather than remaining in the current state indefinitely.

In a representative embodiment, the Pre-Load N-counter state 404 pre-load N-counter 207,307 with the midrange (N/2) value. As shown in the diagram 400, on assertion of Refpulse 312 the LCSM advances to Loop Closed 405.

In a representative embodiment, the Loop Closed state 405 acts to: 1) hold the phase reference value; 2) engage the loop filter 202, 302; and 3) enable writing to the DAC at each Ref pulse 312. At this point the automatic control system predicated by the loop filter design with corresponding parameters will facilitate writing the appropriate values to the DAC 203, 303, thereby forcing a steady state phase lock condition. In this state if the change in phase error reduces to a threshold value or less (ideally zero), the lock detector 316 signals a locked condition at which point the LCSM 201, 301 advances to the Loop Locked state 406. Error conditions are possible that would prevent a locked condition such as the unintentional removal of the reference signal or an inappropriate reference signal frequency for the current DTPLL parameters. In either case, the LCSM advances to the Lost Lock state.

In a representative embodiment, the Loop Locked state 406 functions to: 1) set a locked state indicator value 319; and 2)

save a copy of the loop filter's output value at each Ref pulse 312. Saving the loop filter output is not essential for basic operation of the DTPLL 201, 301. However, the most recent ('last') locked loop filter output can be beneficial in reducing lock time in subsequent lock sequences by pre-populating the control effort value 320 with the saved value. Upon the assertion of Ref Sig Lost or an unlocked signal from the lock detector, the LCSM advances to the Lost Lock state 407.

In a representative embodiment, the Lost Lock state 407 functions to: 1) clear the locked state indicator value 319; 2) disable writing to the DAC 203, 303 so the previous value under a locked condition is held. This action minimizes the frequency error between the oscillator and the external reference while in this state. If the Ref Sig Lost is asserted, the LCSM remains in this state. Otherwise upon assertion of the RefSampValid signal, the LCSM advances to the Initialize Loop whereby a repetitive lock sequence attempt occurs.

As will be appreciated, the various functions of the LCSM 201,301 described in connection with diagram 400 may be implemented in embodiments described in connection with FIGS. 1-3. Moreover, as emphasized previously, the functions of the various states 401-407 are intended to be merely illustrative and in no way limiting of the present teachings.

In view of this disclosure it is noted that variations to DTPLLs described herein can be implemented in keeping with the present teachings. Further, the various topologies, devices, components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A discrete-time phase lock loop (DTPLL), comprising:
an analog section comprising a digital-to-analog converter (DAC) and an oscillator, operative to provide a clock signal based on an input from the DAC; and
a digital signal processor (DSP) comprising:
a loop controller state machine;
a phase detector;
a counter, operative to receive clock signals from the oscillator and to provide a multi-bit count value to the phase detector;
a divider, operative to receive a reference signal and to provide a reference pulse output to the phase detector; and
a loop filter operative to provide a control effort value based on an output from the phase detector, wherein, based on the control effort value an output of the oscillator is changed to reduce a phase error to a steady state value.

2. A DTPLL as claimed in claim 1, wherein the DSP comprises a field programmable gate array (FPGA).

3. A DTPLL as claimed in claim 2, wherein the counter, the divider and the loop filter each comprise respective registers having operational parameters.

4. A DTPLL as claimed in claim 1, wherein the DSP further comprises a phase lock detector, operative to compare the phase error with a threshold and to provide an output to the loop controller state machine indicative of the lock state of the DTPLL.

5. A DTPLL as claimed in claim 1, wherein the loop filter comprises a proportional integral (PI) filter.

6. A DTPLL as claimed in claim 1, wherein the loop filter comprises a proportional integral derivative (PID) filter.

7. A DTPLL as claimed in claim 6, wherein the PID filter provides a signal to the DAC, which drives the oscillator based on the control effort.

8. A DTPLL as claimed in claim 7, wherein the signal from the PID filter further comprises a control effort further comprises a finite bit word, which is added to a calibration value at an adder, and the output from the adder is representative of a change required in an output of the oscillator.

9. A DTPLL as claimed in claim 1, wherein the counter has a maximum value, N, and the divider divides by a reference value, M, and a phase lock condition is approximately: $(f_o/N)=(f_{ref}/M)$, where $f_o$ is an oscillator frequency and $f_{ref}$ is a reference clock frequency.

10. A DTPLL as claimed in claim 1, wherein the oscillator is a voltage controlled oscillator (VCO).

11. An instrument, comprising:
a discrete-time phase lock loop (DTPLL), comprising:
an analog section comprising a digital-to-analog converter (DAC) and an oscillator, operative to provide a clock signal based on an input from the DAC; and
a digital signal processor (DSP) comprising:
a loop controller state machine;
a phase detector;
a counter, operative to receive clock signals from the oscillator and to provide a multi-bit count value to the phase detector;
a divider, operative to receive a reference signal and to provide a reference pulse output to the phase detector; and
a loop filter operative to provide a control effort value based on an output from the phase detector, wherein, based on the control effort value an output of the oscillator is changed to reduce a phase error to a steady state value.

12. An instrument as claimed in claim 11, wherein the DSP comprises a field programmable gate array (FPGA).

13. An instrument as claimed in claim 12, wherein the counter, the divider and the loop filter each comprise respective registers having operational parameters.

14. An instrument as claimed in claim 11, wherein the DSP further comprises a phase lock detector, operative to compare the phase error with a threshold and to provide an output to the loop controller state machine indicative of the lock state of the DTPLL.

15. An instrument as claimed in claim 11, wherein the loop filter comprises a proportional integral (PI) filter.

16. An instrument as claimed in claim 11, wherein the loop filter comprises a proportional integral derivative (PID) filter.

17. An instrument as claimed in claim 16, wherein the PID filter provides a signal to the DAC, which drives the oscillator based on the control effort.

18. An instrument as claimed in claim 17, wherein the signal from the PID filter further comprises a control effort further comprising a finite bit word, which is added to a calibration value at an adder, and the output from the adder is representative of a change required in an output of the oscillator.

19. An instrument as claimed in claim 11, wherein the counter has a maximum value, N, and the divider divides by a reference value, M, and a phase lock condition is approximately: $(f_o/N)=(f_{ref}/M)$, where $f_o$ is an oscillator frequency and $f_{ref}$ is a reference clock frequency.

20. An instrument as claimed in claim 11, wherein the instrument is a measurement instrument.

21. An instrument as claimed in claim 20, wherein the measurement instrument is a handheld instrument.

* * * * *